(12) United States Patent
Hashimoto et al.

(10) Patent No.: US 9,620,393 B2
(45) Date of Patent: Apr. 11, 2017

(54) SUBSTRATE TREATMENT APPARATUS AND SUBSTRATE TREATMENT METHOD

(75) Inventors: Koji Hashimoto, Kyoto (JP); Kazuki Nakamura, Kyoto (JP); Takahiro Yamaguchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 1144 days.

(21) Appl. No.: 13/237,408

(22) Filed: Sep. 20, 2011

(65) Prior Publication Data

US 2012/0073609 A1    Mar. 29, 2012

(30) Foreign Application Priority Data

Sep. 29, 2010 (JP) ................. 2010-219048

(51) Int. Cl.
*B08B 3/04* (2006.01)
*H01L 21/67* (2006.01)

(52) U.S. Cl.
CPC ............................ H01L 21/67051 (2013.01)

(58) Field of Classification Search
CPC ................................................ H01L 21/67051
USPC .................................................. 134/26, 95.1
See application file for complete search history.

(56) References Cited

U.S. PATENT DOCUMENTS

| | | | |
|---|---|---|---|
| 6,017,585 A * | 1/2000 | Thomas | B05C 5/0208 |
| | | | 118/52 |
| 6,089,762 A * | 7/2000 | Mimasaka | G03D 5/04 |
| | | | 396/611 |
| 6,265,323 B1 * | 7/2001 | Nakamura et al. | 438/748 |
| 6,273,104 B1 * | 8/2001 | Shinbara | B08B 3/02 |
| | | | 134/102.1 |
| 7,617,833 B2 | 11/2009 | Izumi et al. | |
| 2004/0065540 A1 * | 4/2004 | Mayer | C23C 18/1619 |
| | | | 204/198 |
| 2008/0280437 A1 * | 11/2008 | Tanaka | C23C 18/1689 |
| | | | 438/678 |
| 2009/0032067 A1 * | 2/2009 | Kojimaru et al. | 134/26 |
| 2009/0107522 A1 | 4/2009 | Uchida et al. | |
| 2010/0151126 A1 | 6/2010 | Iseki et al. | 427/240 |
| 2010/0154834 A1 | 6/2010 | Fukuda et al. | 134/26 |

FOREIGN PATENT DOCUMENTS

| | | |
|---|---|---|
| JP | 3-22428 | 1/1991 |
| JP | 08-130202 | 5/1996 |
| JP | 2001-087725 | 4/2001 |
| JP | 2005-142290 | 6/2005 |
| JP | 2005-286221 | 10/2005 |

(Continued)

*Primary Examiner* — Douglas Lee
(74) *Attorney, Agent, or Firm* — Ostrolenk Faber LLP

(57) ABSTRACT

A substrate treatment apparatus includes: a nozzle having an opposing surface to be opposed to and spaced from a front surface of a substrate rotated by a substrate rotating unit, the nozzle further having an outlet port provided in the opposing surface to be opposed to a rotation center of the substrate; a second liquid supply control unit which controls the second liquid supplying unit to fill a space defined between the front surface and the opposing surface with the second liquid in a liquid filled state, and then stop supplying the second liquid to form a liquid puddle in the space; and a first liquid supply control unit which controls a first liquid supplying unit to spout a first liquid from the outlet port after the formation of the liquid puddle.

7 Claims, 12 Drawing Sheets

(56) References Cited

FOREIGN PATENT DOCUMENTS

| | | |
|---|---|---|
| JP | 2006-344907 | 12/2006 |
| JP | 2007-88381 | 4/2007 |
| JP | 2009-4597 | 1/2009 |
| JP | 2009-105145 | 5/2009 |
| JP | 2009-111163 | 5/2009 |
| JP | 2009-231619 | 10/2009 |
| JP | 2010-123884 | 6/2010 |
| KR | 10-0661867 | 12/2006 |
| KR | 10-2009-0045027 | 5/2009 |
| TW | 201028217 | 8/2010 |

* cited by examiner

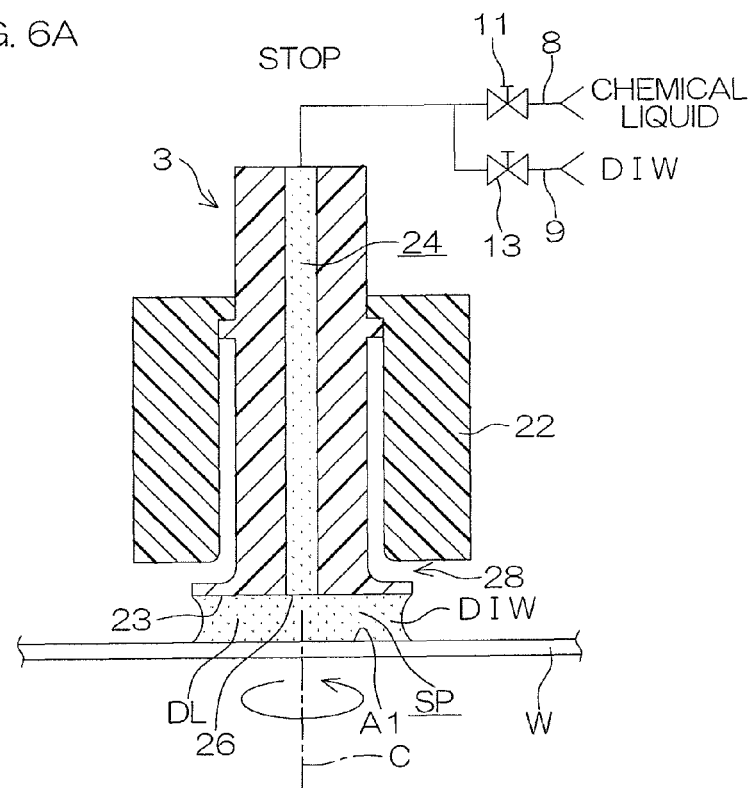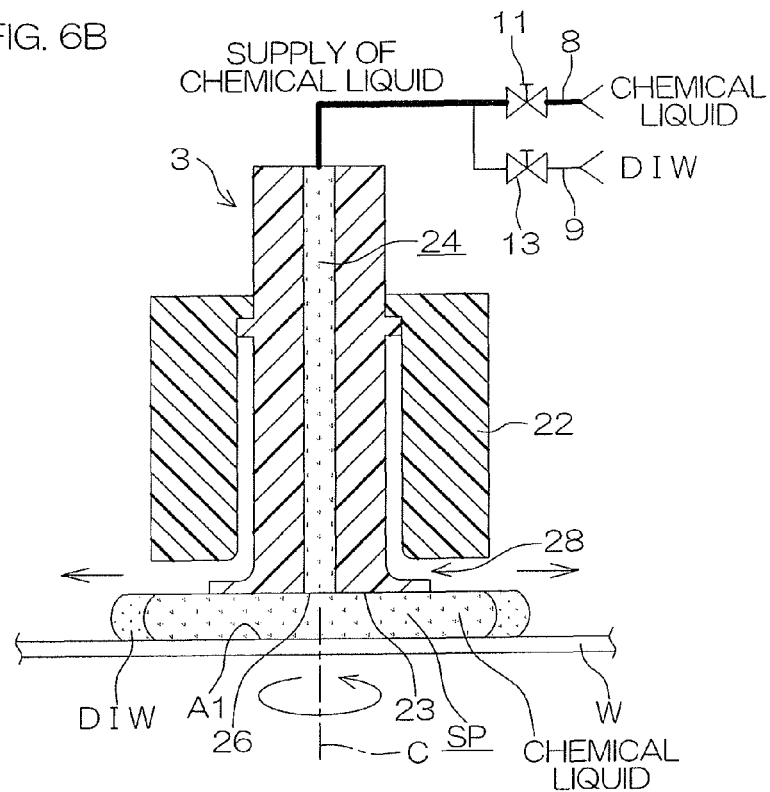

FIG. 7B    SUPPLY OF CHEMICAL LIQUID

SUBSTRATE TREATMENT APPARATUS AND SUBSTRATE TREATMENT METHOD

BACKGROUND OF THE INVENTION

1. Field of the Invention

The present invention relates to a substrate treatment apparatus and a substrate treatment method for treating a substrate with a treatment liquid. Examples of the substrate to be treated include semiconductor wafers, glass substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates, and substrates for solar cells.

2. Description of Related Art

In production processes for semiconductor devices and liquid crystal display devices, substrates such as semiconductor wafers and glass substrates for liquid crystal display panels are treated with a treatment liquid. A substrate treatment apparatus of a single substrate treatment type adapted to treat a single substrate at a time includes a spin chuck which horizontally holds and rotates the substrate, and a nozzle which supplies the treatment liquid to a front surface (to-be-treated surface) of the substrate. The substrate is held by the spin chuck with its front surface up. Then, the treatment liquid is supplied from the nozzle to a center portion of the front surface of the substrate, while the substrate is rotated by the spin chuck. The treatment liquid supplied to the front surface of the substrate receives a centrifugal force generated by the rotation of the substrate to spread from the center portion toward a peripheral edge of the substrate on the front surface of the substrate (see US2009/0032067A1).

When the treatment liquid is spouted from the nozzle with the substrate being rotated by the spin chuck, the treatment liquid spouted from the nozzle is supplied to the center portion of the front surface of the substrate. Thus, a generally round liquid film of the treatment liquid is formed on the front surface of the substrate. The liquid film receives the centrifugal force generated by the rotation of the substrate to spread toward the peripheral edge of the front surface of the substrate.

However, the liquid film of the treatment liquid does not spread generally roundly toward the peripheral edge of the substrate, but often spreads radially before reaching the peripheral edge of the front surface of the substrate. The spreading state of the liquid film of the treatment liquid is shown in FIG. 9. The generally round liquid film of the treatment liquid spreading on the front surface of the substrate includes a plurality of linear liquid film portions L extending radially outward from an outer periphery of the liquid film. This is because the outer periphery of the liquid film of the treatment liquid spreads outward along more hydrophilic portions of the front surface of the substrate.

It may be possible to reliably cover the entire front surface of the substrate with the treatment liquid, for example, by spouting the treatment liquid from the nozzle at a higher flow rate (e.g., at 2.0 L/min or higher). However, this increases the amount of the treatment liquid required for treating a single substrate, and correspondingly increases treatment costs.

SUMMARY OF THE INVENTION

It is an object of the present invention to provide a substrate treatment apparatus and a substrate treatment method which ensure that a treatment liquid can be spread over a wider range of a substrate, while reducing the consumption of the treatment liquid.

A substrate treatment apparatus according to the present invention is adapted to treat a substrate with a treatment liquid, and includes: a substrate rotating unit which horizontally holds and rotates the substrate; a nozzle having an opposing surface to be brought into spaced opposed relation to a region of a front surface of the substrate rotated by the substrate rotating unit, the region of the front surface of the substrate being defined within a peripheral edge of the substrate and containing a rotation center of the substrate, the nozzle further having an outlet port provided in the opposing surface to be brought into opposed relation to the rotation center; a first liquid supplying unit which supplies a first liquid as the treatment liquid to the outlet port; a second liquid supplying unit which supplies a second liquid between the front surface of the substrate and the opposing surface; a second liquid supply control unit which controls the second liquid supplying unit to fill a space defined between the region and the opposing surface with the second liquid in a liquid filled state, and then stop supplying the second liquid to form a liquid puddle in the space; and a first liquid supply control unit which controls the first liquid supplying unit to spout the first liquid from the outlet port after the formation of the liquid puddle.

With this arrangement, the second liquid is supplied between the front surface of the substrate and the opposing surface. Further, the substrate is rotated. The supply of the second liquid is stopped after the space defined between the opposing surface and the region of the front surface of the substrate opposed to the opposing surface is filled with the second liquid in the liquid filled state. Thus, the liquid puddle is formed in the space between the region and the opposing surface. The liquid puddle contacts the front surface of the substrate and the opposing surface. The liquid puddle is stationary with respect to the nozzle and, therefore, is relatively rotated with respect to the rotated substrate. A frictional force acts in a substrate rotating direction on a surface of the liquid puddle contacting the substrate due to friction between the liquid puddle and the front surface of the substrate. A force tangential to the peripheral edge of the surface of the liquid puddle contacting the substrate (hereinafter referred to as "tangential force") acts on the peripheral edge in the substrate rotating direction.

With the first liquid (treatment liquid) spouted from the outlet port of the nozzle in this state, the second liquid of the liquid puddle is laterally forced out of the space, and receives the centrifugal force generated by the rotation of the substrate to spread toward the peripheral edge of the front surface of the substrate. The tangential force acts on the peripheral edge of the surface of the liquid puddle contacting the substrate. Therefore, the second liquid of the liquid puddle spreads toward the peripheral edge, while having a minimum perimeter, i.e., having a round shape. A liquid film formed by subsequently supplying the first liquid (treatment liquid) is dragged by the previously supplied second liquid, and spreads generally roundly toward the peripheral edge of the substrate on the front surface of the substrate. Thus, the front surface of the substrate can be covered with the treatment liquid film. This makes it possible to spread the treatment liquid over a wider range of the upper surface of the substrate by supplying the treatment liquid at a lower flow rate.

The expression "to spread generally roundly" means that the liquid spreads in a round shape and that a plurality of linear liquid film portions protruding radially outward from a round outer periphery of the treatment liquid film each have a length that is not greater than approximately one fifth the diameter of the substrate.

The opposing surface may include a flat surface parallel to the front surface of the substrate held by the substrate rotating unit.

The opposing surface may include a curved surface which becomes closer to the front surface of the substrate in a direction away from the outlet port. With this arrangement, the first liquid (treatment liquid) spouted from the outlet port is supplied over the curved surface to the front surface of the substrate with the space kept in the liquid filled state. This substantially prevents occurrence of eddies between the outlet port and the front surface of the substrate, thereby preventing bubbling in the treatment liquid.

A substrate treatment method according to the present invention includes: an opposing surface positioning step of positioning an opposing surface of a nozzle formed with an outlet port in opposed spaced relation to a front surface of a substrate horizontally held; a rotating step of rotating the substrate about a vertical axis; a liquid puddle forming step of supplying a second liquid between the front surface of the substrate and the opposing surface to fill a space defined between the opposing surface and a region of the front surface of the substrate opposed to the opposing surface with the second liquid in a liquid filled state, and then stop supplying the second liquid to form a liquid puddle in the space; and a treatment liquid spouting step of spouting a first liquid as a treatment liquid from the outlet port, the treatment liquid spouting step being performed in parallel to the rotating step after the liquid puddle forming step.

According to the inventive method, the second liquid is supplied between the front surface of the substrate and the opposing surface. Further, the substrate is rotated. The supply of the second liquid is stopped after the space defined between the opposing surface and the region of the front surface of the substrate opposed to the opposing surface is filled with the second liquid in the liquid filled state. Thus, the liquid puddle is formed in the space between the region and the opposing surface. The liquid puddle contacts the front surface of the substrate and the opposing surface. The liquid puddle is stationary with respect to the nozzle and, therefore, is relatively rotated with respect to the rotated substrate. A frictional force acts in a substrate rotating direction on a surface of the liquid puddle contacting the substrate due to friction between the liquid puddle and the front surface of the substrate. A tangential force acts in the substrate rotating direction on the peripheral edge of the surface of the liquid puddle contacting the substrate.

With the first liquid (treatment liquid) spouted from the outlet port of the nozzle in this state, the second liquid of the liquid puddle is laterally forced out of the space, and receives the centrifugal force generated by the rotation of the substrate to spread toward the peripheral edge of the front surface of the substrate. The tangential force acts on the peripheral edge of the surface of the liquid puddle contacting the substrate. Therefore, the second liquid of the liquid puddle spreads toward the peripheral edge, while having a minimum perimeter, i.e., having a generally round shape. A liquid film formed by subsequently supplying the first liquid (treatment liquid) is dragged by the previously supplied second liquid, and spreads generally roundly toward the peripheral edge of the substrate on the front surface of the substrate. Thus, the front surface of the substrate can be covered with the treatment liquid film. This makes it possible to spread the treatment liquid over a wider range of the upper surface of the substrate by supplying the treatment liquid at a lower flow rate.

The liquid puddle forming step may include a water puddle forming step of supplying water between the front surface of the substrate and the opposing surface to form a water puddle in the space. In this case, the treatment liquid spouting step may include a chemical liquid spouting step of spouting a chemical liquid from the outlet port.

According to this method, the liquid puddle is formed by using water, so that no treatment is performed on the region, which is not affected by the liquid puddle formed in the space between the opposing surface and the region of the front surface of the substrate opposed to the opposing surface. This substantially prevents uneven treatment of the front surface of the substrate.

The method may further include a water spouting step of spouting water from the outlet port, the water spouting step being performed in parallel to the rotating step after the water puddle forming step before the chemical liquid spouting step. In this case, the spouting of the chemical liquid in the chemical liquid spouting step may follow the spouting of the water in the water spouting step.

According to this method, the water is spouted from the outlet port prior to the spouting of the chemical liquid from the outlet port after the formation of the water puddle in the space defined between the opposing surface and the region of the front surface opposed to the opposing surface.

When the water is spouted from the outlet port of the nozzle, the water of the water puddle is laterally forced out of the space, and receives the centrifugal force generated by the rotation of the substrate to spread toward the peripheral edge of the front surface of the substrate. The tangential force acts on a peripheral edge of a surface of the water puddle contacting the front surface of the substrate. Therefore, the water of the water puddle spreads toward the peripheral edge, while having a minimum perimeter, i.e., having a generally round shape. A water film formed by subsequently supplying the water is dragged by the previously supplied water, and spreads generally roundly toward the peripheral edge of the substrate on the front surface of the substrate. Thus, the front surface of the substrate is covered with the water film.

Following the spouting of the water, the chemical liquid is spouted from the outlet port, whereby the chemical liquid is supplied into the space. Therefore, the water in the space is replaced with the chemical liquid with the space kept in the liquid filled state, so that the water film covering the front surface of the substrate is replaced with the chemical liquid film. Thus, the chemical liquid can smoothly spread over a wider range of the front surface of the substrate.

Where the treatment liquid spouting step includes the chemical liquid spouting step of spouting the chemical liquid from the outlet port, the liquid puddle forming step may include a chemical liquid puddle forming step of supplying the same chemical liquid as that spouted in the chemical liquid spouting step between the front surface of the substrate and the opposing surface to form a liquid puddle of the chemical liquid in the space.

The foregoing and other objects, features and effects of the present invention will become more apparent from the following detailed description of preferred embodiments with reference to the attached drawings.

BRIEF DESCRIPTION OF THE DRAWINGS

FIGS. 6A to 6C are schematic sectional views showing the states of the apparatus at the beginning of a chemical liquid treatment step in Exemplary Process 2.

FIGS. 7A to 7D are schematic sectional views showing the states of the apparatus at the beginning of a chemical liquid treatment step in Exemplary Process 3.

DETAILED DESCRIPTION OF PREFERRED EMBODIMENTS

Figure 1:
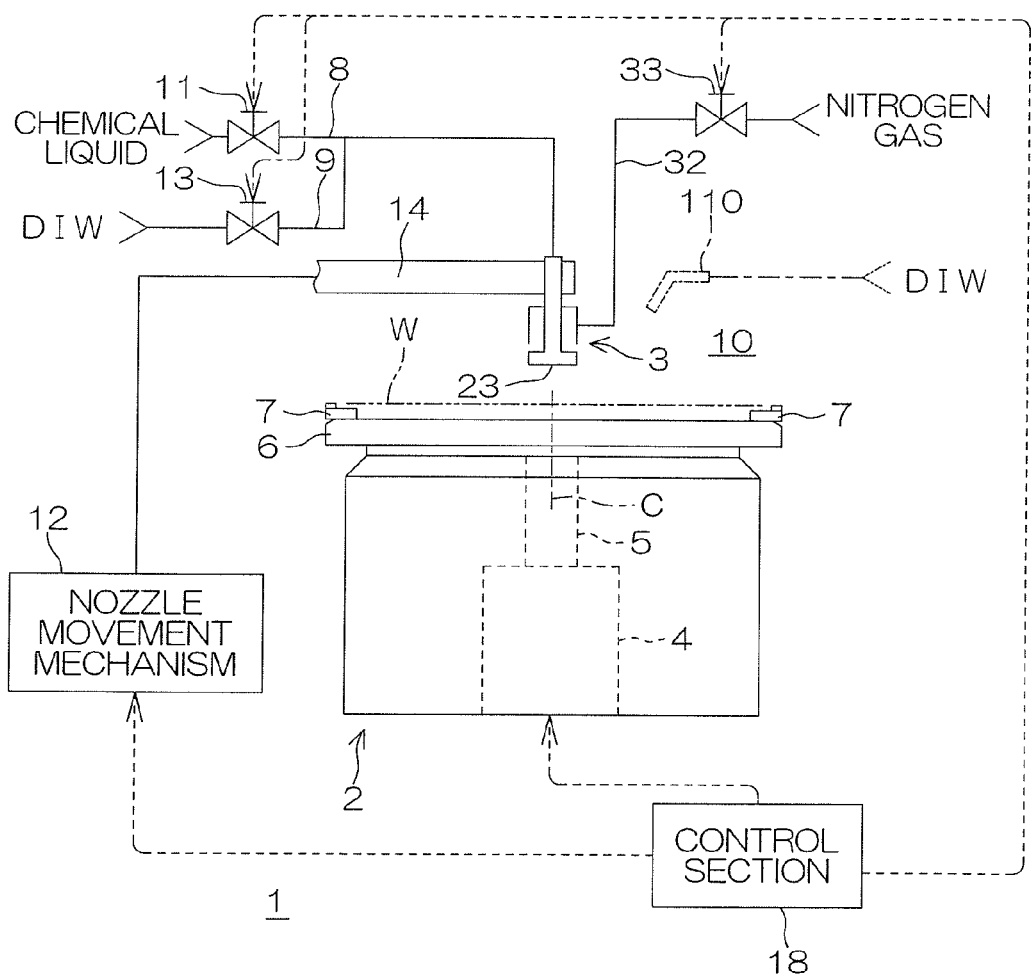
FIG. 1 is a schematic diagram showing the construction of a substrate treatment apparatus according to a first embodiment of the present invention.

FIG. 1 is a schematic diagram showing the construction of a substrate treatment apparatus 1 according to a first embodiment of the present invention. The substrate treatment apparatus 1 is of a single substrate treatment type, which is adapted to treat a front surface (to-be-treated surface) of a round semiconductor wafer W (hereinafter referred to simply as "wafer W") as an exemplary substrate with a treatment liquid (a chemical liquid or a rinse liquid (in this embodiment, DIW (deionized water) is used as an example of the rinse liquid)).

The substrate treatment apparatus 1 includes a treatment chamber 10 defined by a partition wall (not shown), a spin chuck (substrate rotating unit) 2 which horizontally holds and rotates the wafer W, and a nozzle 3 which supplies the treatment liquid onto an upper surface (front surface) of the wafer W held by the spin chuck 2. The spin chuck 2 and the nozzle 3 are provided in the treatment chamber 10.

The spin chuck 2 includes a spin motor 4, a spin shaft 5 unitary with a drive shaft of the spin motor 4, a disk-shaped spin base 6 generally horizontally attached to an upper end of the spin shaft 5, and a plurality of holder members 7 disposed generally equidistantly along a peripheral edge of the spin base 6. The spin base 6 is rotated by a rotative drive force of the spin motor 4 with the wafer W held by the holder members 7, whereby the spin chuck 2 can generally horizontally hold the wafer W and rotate the wafer W together with the spin base 6 about a rotation axis C.

The spin chuck 2 is not limited to the chuck of the holder type, but may be a chuck of a vacuum suction type (vacuum chuck) which, for example, sucks a back surface of the wafer W by vacuum suction to horizontally hold the wafer W and, in this state, is rotated about the vertical rotation axis to rotate the wafer W.

A chemical liquid supply pipe 8 and a DIW supply pipe 9 are connected to the nozzle 3. A chemical liquid valve 11 for opening and closing the chemical liquid supply pipe 8 is provided in the chemical liquid supply pipe 8. A DIW valve 13 for opening and closing the DIW supply pipe 9 is provided in the DIW supply pipe 9.

With this arrangement, the chemical liquid can be supplied from a chemical liquid supply source to the nozzle 3 through the chemical liquid supply pipe 8 and spouted from an outlet port 26 of the nozzle 3 (see FIG. 2) by opening the chemical liquid valve 11 with the DIW valve 13 being closed. Further, the DIW can be supplied from a DIW supply source to the nozzle 3 through the DIW supply pipe 9 and spouted from the outlet port 26 of the nozzle 3 by opening the DIW valve 13 with the chemical liquid valve 11 being closed.

The chemical liquid to be used is properly selected according to a treatment to be performed on the front surface of the wafer W. For example, SC1 (ammonia-hydrogen peroxide mixture) or the like is used for a cleaning treatment for removing particles from the front surface of the wafer W. Hydrofluoric acid, BHF (buffered HF) or the like is used for a cleaning treatment for etching off an oxide film or the like from the front surface of the wafer W. A resist stripping liquid or a polymer removing liquid such as SPM (sulfuric acid-hydrogen peroxide mixture), SC1 (ammonia-hydrogen peroxide mixture) or the like is used for a resist stripping treatment for stripping a resist film formed on the front surface of the wafer W or for a polymer removing treatment for removing a resist residue of a polymer from the front surface of the wafer W after the resist stripping. Hydrofluoric acid, SC2 (hydrochloric acid-hydrogen peroxide mixture), SPM (sulfuric acid-hydrogen peroxide mixture) or the like is used for a cleaning treatment for removing metal contaminants.

During the treatment performed by the substrate treatment apparatus 1, the chemical liquid or the DIW is spouted at a lower flow rate (e.g., about 0.5 L/min) from the nozzle 3.

The nozzle 3 is attached to a distal end of an arm 14. The arm 14 horizontally extends above the spin chuck 2. A nozzle movement mechanism 12 including a motor is connected to the arm 14. The nozzle movement mechanism 12 pivots the arm 14 within a horizontal plane about a vertical pivot axis defined on a lateral side of the spin chuck 2. By the pivoting of the arm 14, the nozzle 3 is horizontally moved above the spin chuck 2. Further, the nozzle movement mechanism 12 moves up and down the arm 14. By the up and down movement of the arm 14, the nozzle 3 is moved up and down. Thus, the nozzle movement mechanism 12 serves as a toward/away movement mechanism for moving the nozzle 3 toward and away from the wafer W.

When the wafer W is to be treated, the nozzle 3 is located at an adjacent position (to be described later) by the pivotal movement and the up and down movement of the arm 14. When no treatment is performed on the wafer W, the nozzle 3 is located at a retracted position outside a rotation range of the wafer W.

Figure 2:
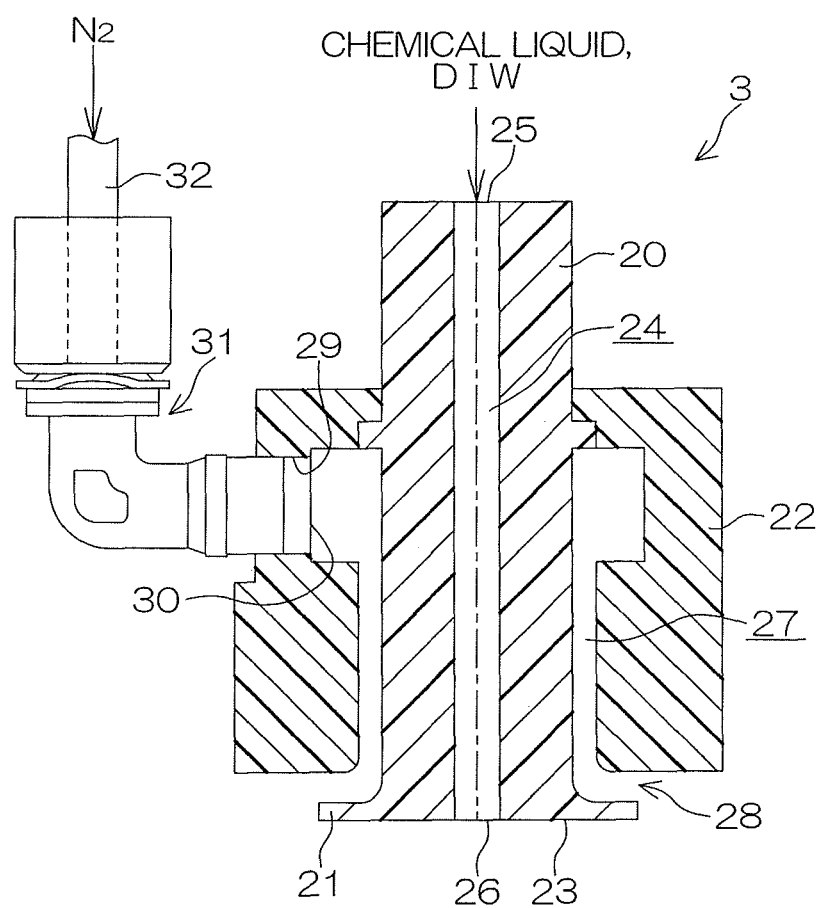
FIG. 2 is a sectional view of a nozzle shown in FIG. 1.

FIG. 2 is a sectional view of the nozzle 3. The structure of the nozzle 3 will be described with reference to FIGS. 1 and 2.

The nozzle 3 includes a cylindrical tubular portion 20, a disk portion 21 fixed to a lower end of the tubular portion 20 coaxially with the tubular portion 20, and a cover 22 surrounding the tubular portion 20 to cover the tubular portion 20.

The tubular portion 20 and the disk portion 21 are formed of a resin material such as polyvinyl chloride, PCTFE (polychlorotrifluoroethylene), PVDF (polyvinylidene difluoride) or PTFE (polytetrafluoroethylene).

The disk portion 21 has a round opposing surface 23 provided in a lower surface thereof to be opposed to the front surface of the wafer W held by the spin chuck 2. The opposing surface 23 is a horizontal flat surface, which has a radius smaller than the radius (rotation radius) of the wafer W held by the spin chuck (e.g., a radius about 1/10 to about 1/8 the radius of the wafer W). The opposing surface 23 has been imparted with a hydrophilic property.

A flow passage 24 vertically extends through the tubular portion 20 and the disk portion 21. The flow passage 24 has an inlet port 25 provided at a proximal end of the tubular portion 20, and a generally round opening provided at the center of the opposing surface 23 and serving as the outlet port 26. The chemical liquid or the DIW is supplied into the flow passage 24 through the inlet port 25, then flows through the flow passage 24, and is spouted from the outlet port 26.

An annular nitrogen gas flow passage 27 is defined between an inner wall of the cover 22 and an outer wall of the tubular portion 20 for supplying nitrogen gas ($N_2$) as an exemplary inert gas to the front surface of the wafer W. The nitrogen gas flow passage 27 has an annular nitrogen gas outlet port 28 along a lower edge of the outer wall of the tubular portion 20. The cover 22 has a through-hole 29 extending therethrough from its inner wall to its outer wall. The through-hole 29 has an inlet port 30 which opens in the inner wall of the cover 22. A nitrogen gas supply pipe 32 is connected to the inlet port 30 via a joint 31. A nitrogen gas valve 33 (see FIG. 1) for opening and closing the nitrogen gas supply pipe 32 is provided in the nitrogen gas supply pipe 32. With the nitrogen gas valve 33 being open, the nitrogen gas is horizontally spouted radially outward of the disk portion 21 from the nitrogen gas outlet port 28.

As shown in FIG. 1, the substrate treatment apparatus 1 includes a control section 18 including a microcomputer. The control section 18 controls the spin motor 4 and the nozzle movement mechanism 12 according to a predetermined program. Further, the control section 18 controls the opening and closing of the chemical liquid valve 11, the DIW valve 13 and the nitrogen gas valve 33.

Figure 3:
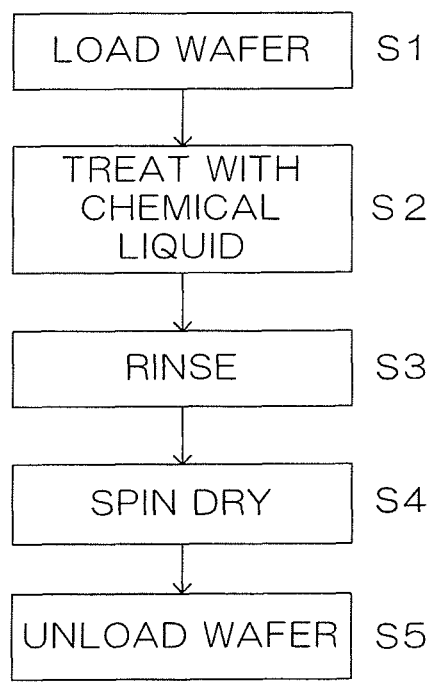
FIG. 3 is a process diagram showing Exemplary Process 1 to be performed by the substrate treatment apparatus shown in FIG. 1.

FIG. 3 is a process diagram showing Exemplary Process 1 to be performed by the substrate treatment apparatus 1. FIGS. 4A to 4F are schematic sectional views showing the states of the apparatus at the beginning of a chemical liquid treatment step in Exemplary Process 1. Exemplary Process 1 will be described with reference to FIGS. 1 to 4F.

A wafer W to be treated is loaded into the treatment chamber 10 by a transport robot (not shown) (Step S1), and held by the spin chuck 2 with its front surface up. At this time, the nozzle 3 is located at the retracted position outside the rotation range of the wafer W so as not to hinder the loading of the wafer W.

Figure 4A:
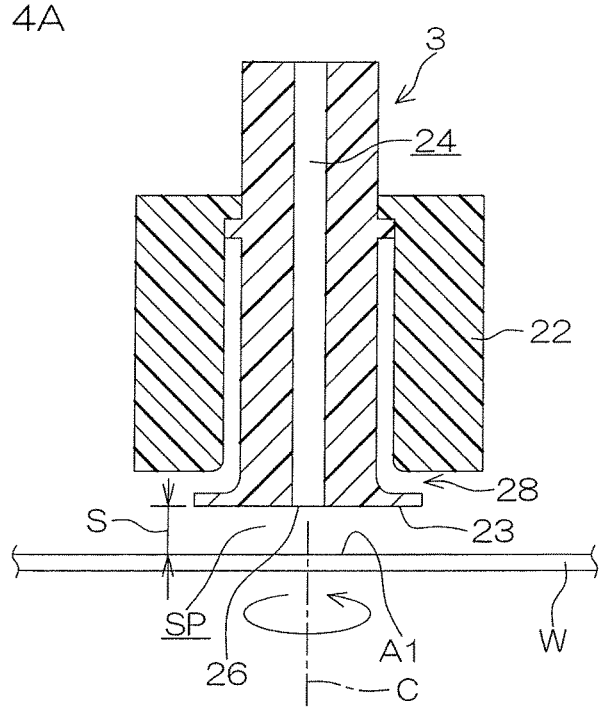
FIGS. 4A to 4F are schematic sectional views showing the states of the apparatus at the beginning of a chemical liquid treatment step in Exemplary Process 1.

After the wafer W is held by the spin chuck 2, the control section 18 controls the nozzle movement mechanism 12 to pivot the arm 14. By the pivoting of the arm 14, the nozzle 3 is moved from the retracted position to a position on the rotation axis C of the wafer W. The control section 18 controls the nozzle movement mechanism 12 to move down the nozzle 3 to the adjacent position. With the nozzle 3 located at the adjacent position, as shown in FIG. 4A, the opposing surface 23 of the nozzle 3 is opposed to and spaced a minute distance S (e.g., about 5 to about 10 mm) from the front surface of the wafer W. In this state, the center of the opposing surface 23 is aligned with the rotation axis C of the wafer W.

The control section 18 controls the spin motor 4 to start rotating the wafer W.

Figure 4B:
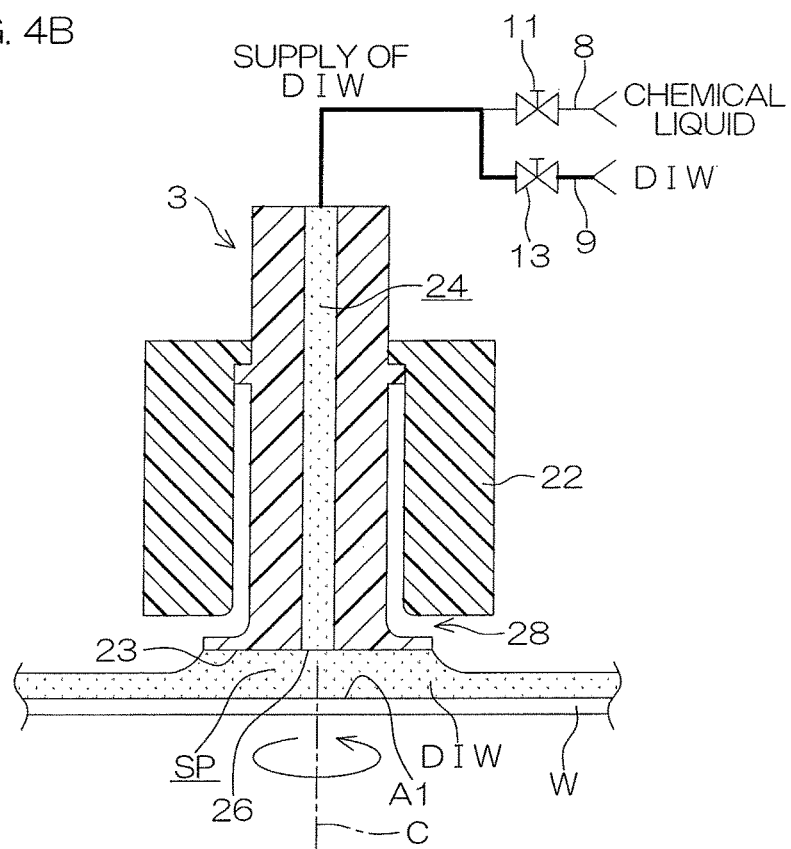

Immediately after the rotation of the wafer W is started, the control section 18 spouts the DIW from the outlet port 26 of the nozzle 3 by opening the DIW 13 with the chemical liquid valve 11 kept closed. Thus, as shown in FIG. 4B, the DIW is supplied into a space SP defined between the opposing surface 23 and a region A1 of the front surface of the wafer W opposed to the opposing surface 23 (hereinafter referred to as "opposed region A1"). Thus, the space defined between the opposing surface 23 and the opposed region A1 is filled with the DIW in a liquid filled state, and the DIW overflows to be laterally forced out of the space SP. The DIW thus forced out receives a centrifugal force generated by the rotation of the wafer W to spread toward the peripheral edge of the front surface of the wafer W.

Figure 4C:
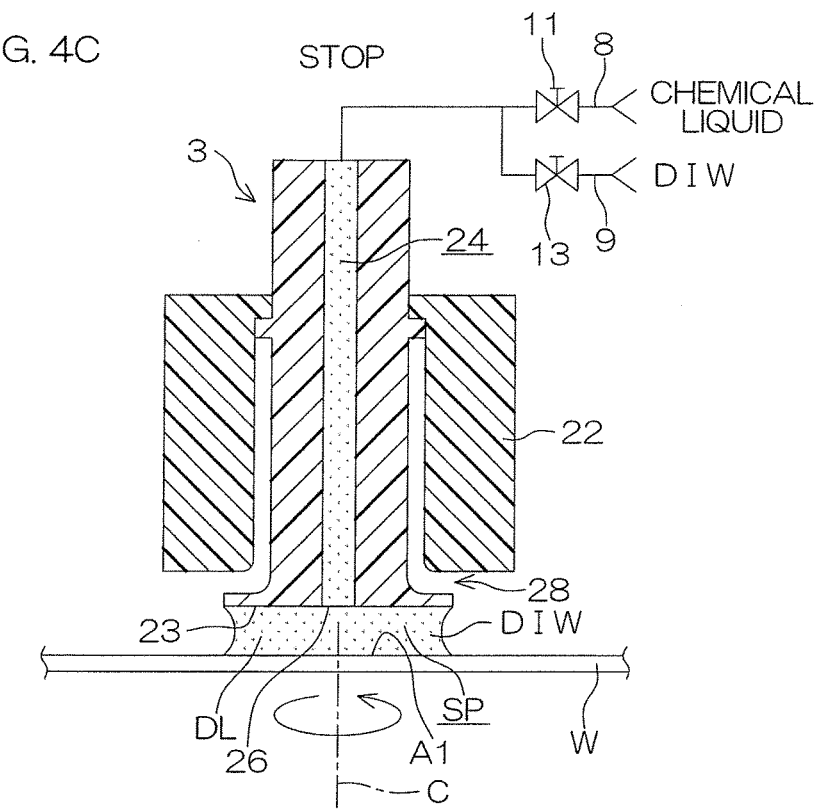
Figure 4D:
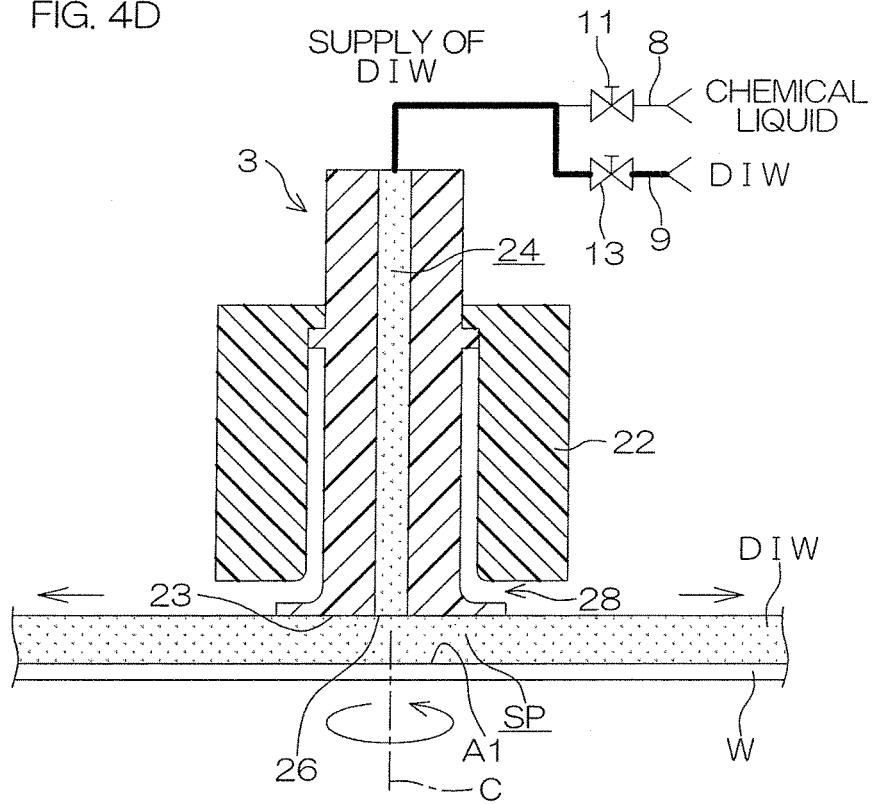

After the space SP defined between the opposing surface 23 and the opposed region A1 is filled with the DIW in the liquid filled state (e.g., after a lapse of 0.5 to 1.0 second from the start of the spouting of the DIW), the control section 18 closes the DIW valve 13 to stop spouting the DIW. Thus, the supply of the DIW into the space SP is stopped, but the rotation of the wafer W is continued. A part of the DIW present outside the space SP receives a centrifugal force generated by the rotation of the wafer W and scatters from the peripheral edge of the wafer W. Thus, as shown in FIG. 4C, a DIW liquid puddle DL is formed in the space SP.

The DIW liquid puddle DL contacts the entire opposed region A1 of the wafer W and the entire opposing surface 23 of the nozzle 3. The opposing surface 23 is stationary in a non-rotative state, so that the DIW liquid puddle DL receives a dragging force from the opposing surface 23 of the nozzle 3 to be stationary with respect to the nozzle 3. Therefore, the liquid puddle DL is relatively rotated with respect to the wafer W, so that a frictional force acts in a wafer rotating direction on a lower surface of the DIW liquid puddle DL due to friction between the DIW liquid puddle DL and the opposed region A1 of the wafer W. A tangential force (a force tangential to the peripheral edge of the lower surface of the DIW liquid puddle DL) acts in the wafer rotating direction on the peripheral edge of the lower surface of the DIW liquid puddle DL.

Figure 5:
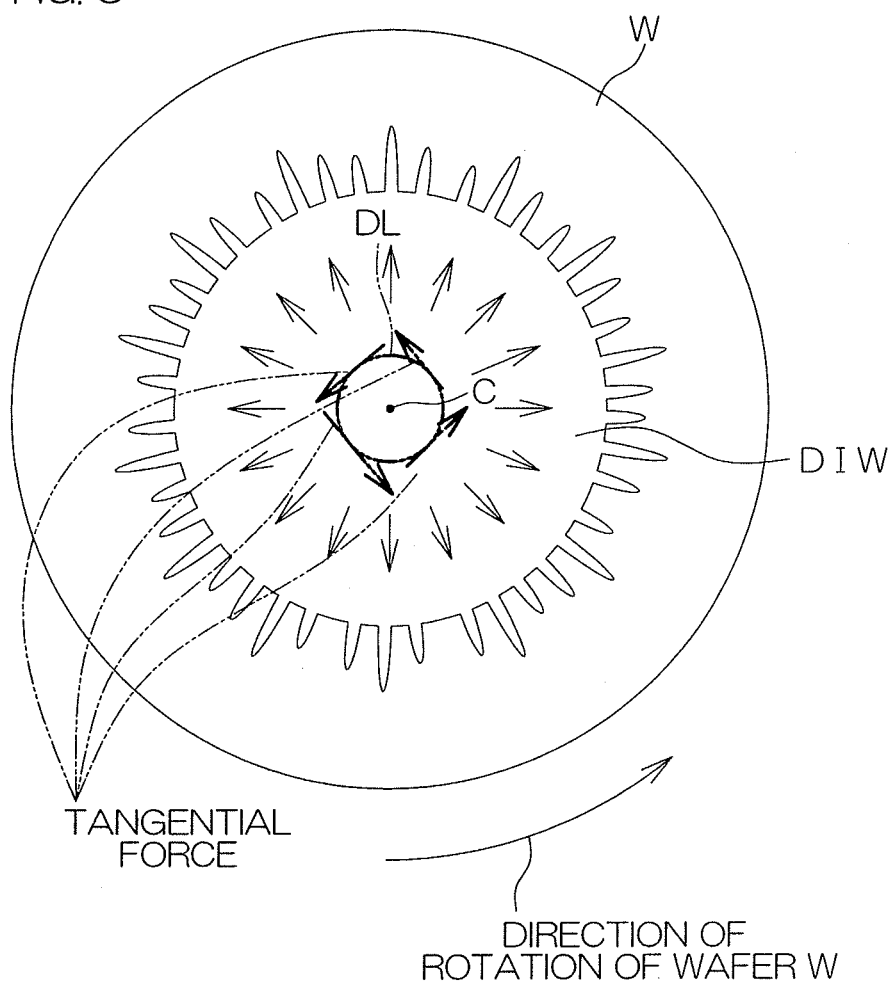
FIG. 5 is a schematic plan view showing the spreading state of a liquid film of DIW in Exemplary Process 1.

At predetermined supply start timing after the rotation speed of the wafer W reaches a predetermined liquid treatment rotation speed (e.g., about 500 rpm), the control section 18 opens the DIW valve 13 with the chemical liquid valve 11 kept closed to spout the DIW from the outlet port 26 of the nozzle 3. Thus, the DIW is supplied into the space SP defined between the opposing surface 23 and the opposed region A1. Therefore, the DIW liquid puddle DL is laterally forced out of the space SP and receives a centrifugal force generated by the rotation of the wafer W to move toward the peripheral edge of the wafer W. The spreading state of the DIW liquid film observed at this time is shown in FIG. 5. The tangential force acts on the outer periphery of the lower surface of the DIW liquid puddle DL. Therefore, the DIW of the liquid puddle DL spreads toward the peripheral edge, while having a minimum perimeter, i.e., having a generally round shape. A DIW liquid film formed by subsequently supplying the DIW is dragged by the previously supplied DIW of the liquid puddle DL, and spreads generally roundly toward the peripheral edge of the wafer W on the front surface of the wafer W. Thus, the front surface of the wafer W is generally entirely covered with the DIW liquid film.

Figure 4E:
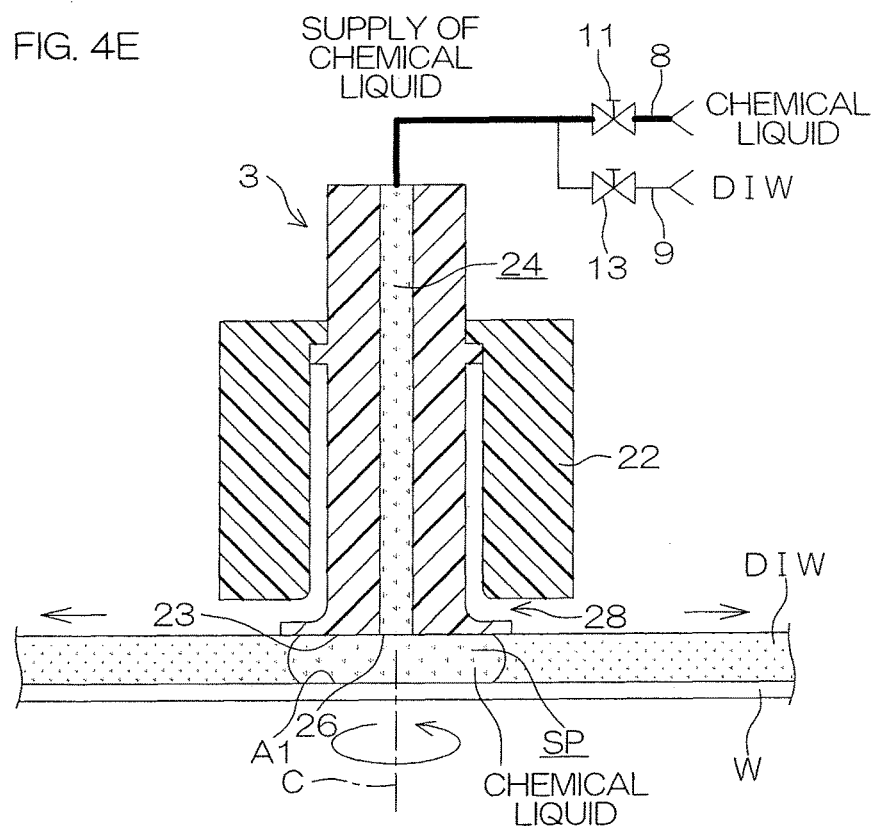
Figure 4F:
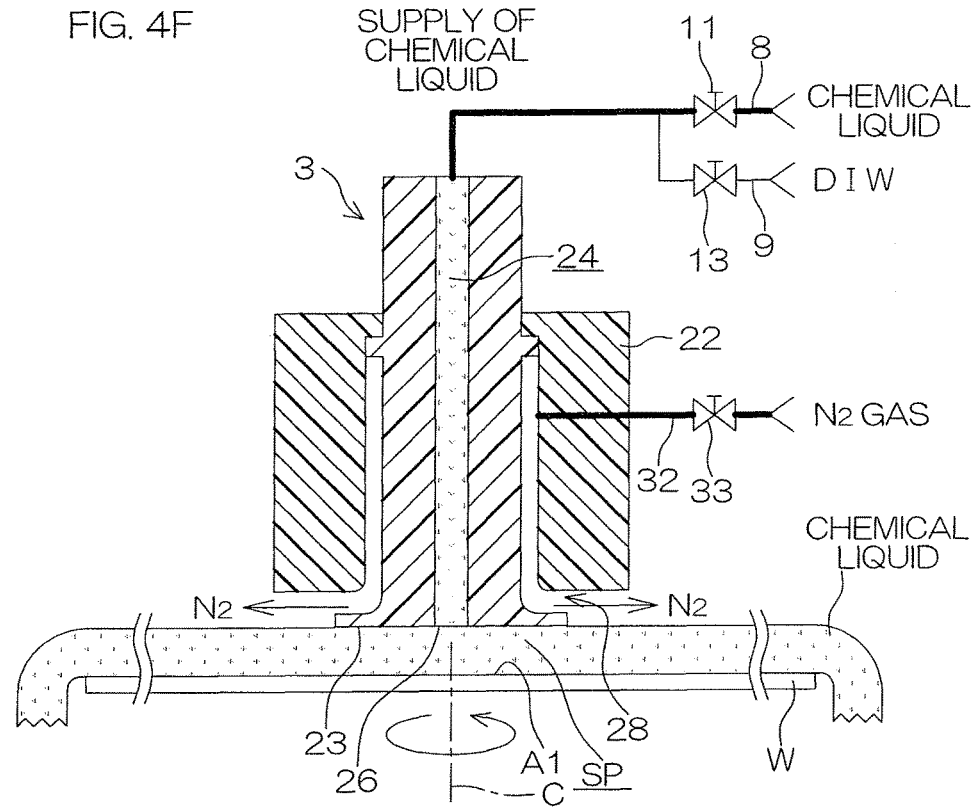

After a lapse of a predetermined period (e.g., 2 seconds) from the start of the spouting of the DIW from the outlet port 26, the control section 18 closes the DIW valve 13 to stop spouting the DIW from the outlet port 26. At the same time, the control section 18 opens the chemical liquid valve 11 to spout the chemical liquid from the outlet port 26 (Step S2: chemical liquid treatment step). Following the spouting of the DIW, the chemical liquid is spouted from the outlet port 26, whereby the chemical liquid is supplied into the space SP defined between the opposing surface 23 and the opposed region A1 of the front surface of the wafer W. At this time, the chemical liquid is spouted at a lower flow rate (e.g., about 0.5 L/min). As shown in FIG. 4E, the chemical liquid supplied into the space SP spreads in the space SP filled with the DIW to force the DIW out of the space SP. With the space SP kept in the liquid filled state, the DIW in the space SP is replaced with the chemical liquid. The resulting chemical liquid film spreads toward the peripheral edge, while having a minimum perimeter, i.e., having a generally round shape. A chemical liquid film formed by subsequently supplying the chemical liquid is dragged by the previous chemical liquid film, and spreads generally roundly toward the peripheral edge of the wafer W on the front surface of the wafer W. Thus, as shown in FIG. 4F, the front surface of the wafer W is generally entirely covered with the chemical liquid film. That is, the DIW liquid film covering the front surface of the wafer W is replaced with the chemical liquid film.

During the chemical liquid treatment, the nitrogen gas valve 33 is open, so that the nitrogen gas is radially and laterally spouted from the nitrogen gas outlet port 28. The nitrogen gas is supplied to the periphery of the chemical liquid film on the wafer W, whereby the wafer W can be treated with the chemical liquid in a nitrogen gas atmosphere. This substantially prevents the oxidation of the chemical liquid on the wafer W, ensuring proper treatment of the wafer W. The supply of the nitrogen gas is not essential.

After a lapse of a predetermined period from the start of the spouting of the chemical liquid from the outlet port 26, the control section 18 closes the chemical liquid valve 11 to stop spouting the chemical liquid from the outlet port 26. At the same time, the control section 18 opens the DIW valve 13 to spout the DIW from the outlet port 26 (Step S3: rinsing step). Following the spouting of the chemical liquid, the DIW is spouted from the outlet port 26, and supplied into the space SP defined between the opposing surface 23 and the opposed region A1 of the front surface of the wafer W. At this time, the DIW is spouted at a lower flow rate (e.g., about 0.5 L/min). The DIW supplied into the space SP spreads in the space SP filled with the chemical liquid to force the chemical liquid out of the space SP. With the space SP kept in the liquid filled state, the chemical liquid in the space SP is replaced with the DIW. The resulting DIW liquid film spreads toward the peripheral edge, while having a minimum perimeter, i.e., having a generally round shape. A DIW liquid film formed by subsequently supplying the DIW is dragged by the previous DIW liquid film, and spreads generally roundly toward the peripheral edge of the wafer W on the front surface of the wafer W. Thus, the front surface of the wafer W is generally entirely covered with the DIW liquid film. That is, the chemical liquid film covering the front surface of the wafer W is replaced with the DIW liquid film.

After a lapse of a predetermined period from the start of the spouting of the DIW, the control section 18 closes the DIW valve 13 to stop spouting the DIW from the outlet port 26. Further, the control section 18 controls the nozzle movement mechanism 12 to move up and pivot the arm 14 to return the nozzle 3 to the retracted position on the lateral side of the spin chuck 2. Then, the control section 18 accelerates the spin chuck 2 to a higher rotation speed (e.g., about 2500 rpm). Thus, a spin dry operation is performed to spin away the DIW from the upper surface of the wafer W rinsed with the DIW for drying (Step S4: spin drying step). After the spin drying step is performed for a predetermined period, the rotation of the spin chuck 2 is stopped. Then, the wafer W is unloaded by the transport robot (not shown) (Step S5).

According to this embodiment, as described above, the liquid film of the chemical liquid or the DIW spreads generally roundly toward the peripheral edge on the front surface of the wafer W. Thus, the front surface of the wafer W can be covered with the liquid film of the chemical liquid or the DIW. This makes it possible to spread the chemical liquid or the DIW on a wider range of the upper surface of the wafer W by supplying the chemical liquid or the DIW at a lower flow rate.

Since the liquid puddle DL is formed of the DIW, no treatment is performed on the opposed region A1, which is not affected by the DIW liquid puddle DL. This substantially prevents uneven treatment of the front surface of the wafer W.

Figure 6C:
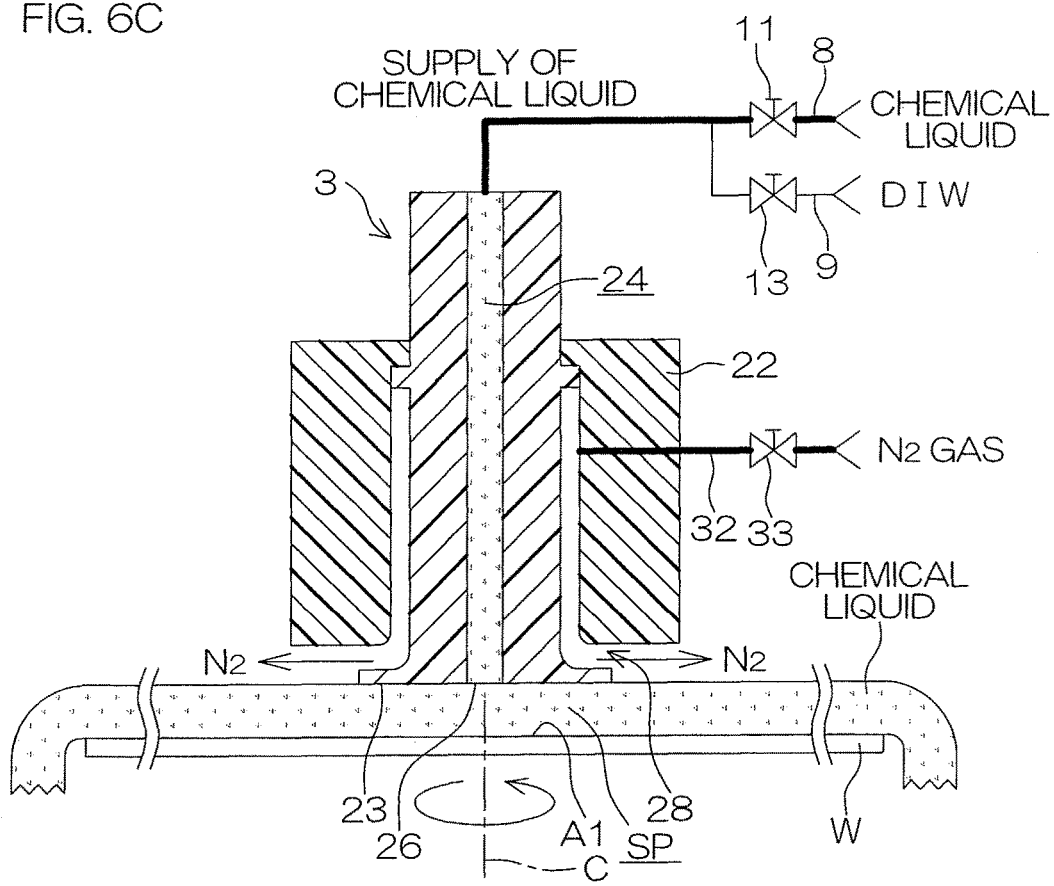

Next, Exemplary Process 2 to be performed by the substrate treatment apparatus 1 will be described. FIGS. 6A to 6C are schematic sectional views showing the states of the apparatus at the beginning of a chemical liquid treatment step in Exemplary Process 2. Exemplary Process 2 will hereinafter be described with reference to FIGS. 1 to 3 and FIGS. 6A to 6C. Duplicate description for common features of Exemplary Processes 1 and 2 will be omitted.

Exemplary Process 2 differs from Exemplary Process 1 mainly in that, after the DIW liquid puddle DL is formed between the opposed region A1 of the wafer W and the opposing surface 23 of the nozzle 3, not the DIW but the chemical liquid is spouted from the outlet port 26.

After the DIW is spouted from the outlet port 26 to fill the space SP defined between the opposing surface 23 and the opposed region A1 with the DIW in the liquid filled state, the spouting of the DIW from the outlet port 26 is stopped and the DIW liquid puddle DL is formed as shown in FIG. 6A.

At predetermined supply start timing after the rotation speed of the wafer W reaches a predetermined liquid treatment rotation speed (e.g., about 500 rpm), the control section 18 opens the chemical liquid valve 11 with the DIW valve 13 kept closed to spout the chemical liquid from the outlet port 26 of the nozzle 3. Therefore, the DIW liquid puddle DL is laterally forced out of the space SP, and receives a centrifugal force generated by the rotation of the wafer W to move toward the peripheral edge of the wafer W. The tangential force acts on the outer periphery of the lower surface of the DIW liquid puddle DL. Therefore, the DIW of the liquid puddle DL spreads toward the peripheral edge, while having a minimum perimeter, i.e., having a generally round shape. A chemical liquid film formed by subsequently supplying the chemical liquid is dragged by the previously supplied DIW of the liquid puddle DL, and spreads generally roundly toward the peripheral edge of the wafer W on the front surface of the wafer W (see FIG. 6B). Thus, the front surface of the wafer W is generally entirely covered with the chemical liquid film as shown in FIG. 6C.

Next, Exemplary Process 3 to be performed by the substrate treatment apparatus 1 will be described. FIGS. 7A to 7D are schematic sectional views showing the states of the apparatus at the beginning of a chemical liquid treatment step in Exemplary Process 3. Exemplary Process 3 will be described with reference to FIGS. 1 to 3 and FIGS. 7A to 7D. Duplicate description for common features of Exemplary Processes 1 and 3 will be omitted.

Exemplary Process 3 differs from Exemplary Process 1 mainly in that a chemical liquid puddle CL is formed instead of the DIW liquid puddle DL in the space SP defined between the opposing surface 23 and the opposed region A1.

Figure 7A:
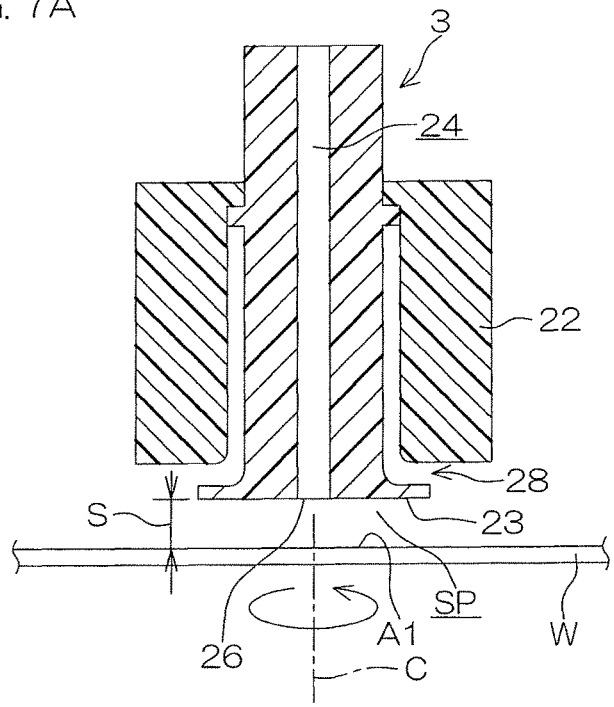
Figure 7A:
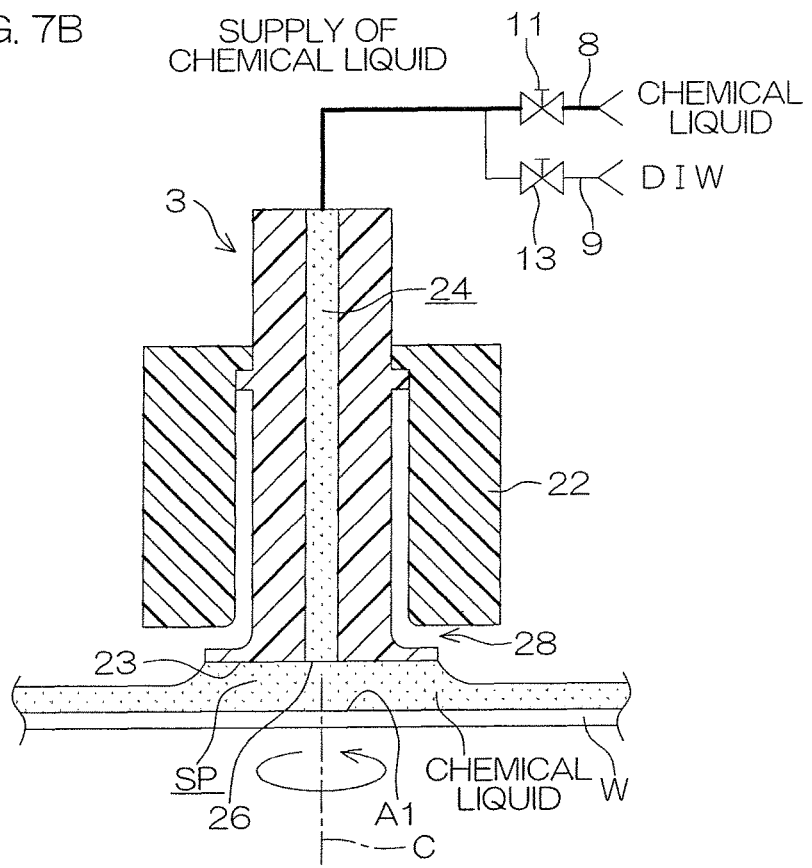

As shown in FIG. 7A, the nozzle 3 is located at the adjacent position, and the rotation of the wafer W is started. Immediately after the start of the rotation of the wafer W, as shown in FIG. 7B, the control section 18 opens the chemical liquid valve 11 with the DIW valve 13 kept closed to spout the chemical liquid from the outlet port 26 of the nozzle 3. Thus, the chemical liquid is supplied into the space SP defined between the opposing surface 23 and the opposed region A1, whereby the space SP is filled with the chemical liquid in the liquid filled state and the chemical liquid overflows to be laterally forced out of the space SP. The chemical liquid thus forced out receives a centrifugal force generated by the rotation of the wafer W to spread toward the peripheral edge of the wafer W on the front surface of the wafer W.

Figure 7C:
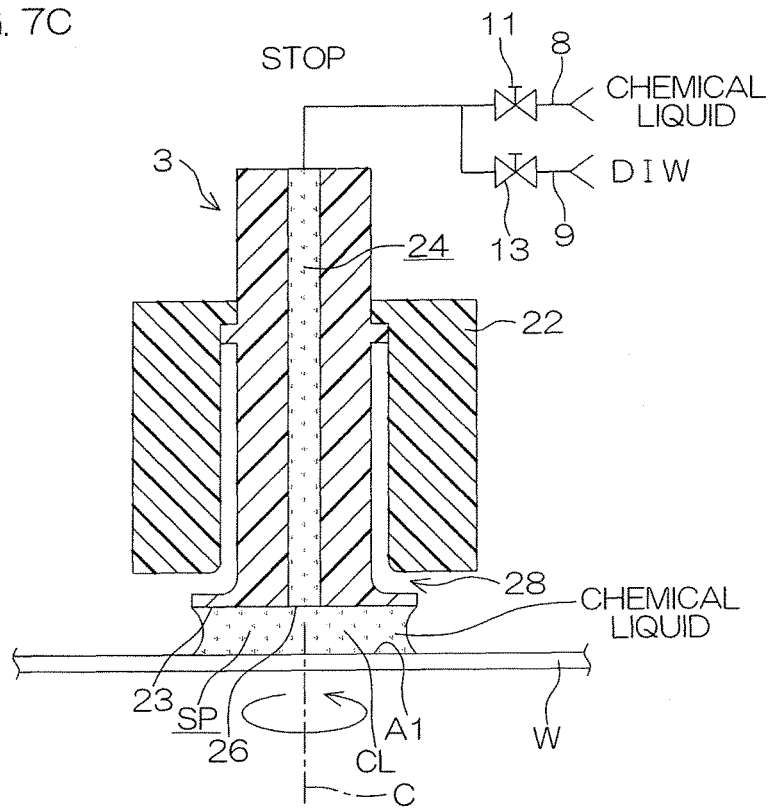

After the space SP is brought into the liquid filled state (e.g., after a lapse of 0.5 to 1.0 second from the start of the spouting of the chemical liquid), the control section 18 closes the chemical liquid valve 11 to stop spouting the chemical liquid. Thus, the supply of the chemical liquid into the space SP is stopped, but the rotation of the wafer W is continued. The chemical liquid present outside the space SP receives a centrifugal force generated by the rotation of the wafer W and scatters from the peripheral edge of the wafer W. Thus, as shown in FIG. 7C, the chemical liquid puddle CL is formed between the opposed region A1 of the wafer W and the opposing surface 23 of the nozzle 3.

The chemical liquid puddle CL contacts the entire opposed region A1 of the wafer W and the entire opposing surface 23 of the nozzle 3. The chemical liquid puddle CL receives a dragging force from the opposing surface 23 of the nozzle 3 to be stationary with respect to the nozzle 3. Therefore, the chemical liquid puddle CL is relatively rotated with respect to the wafer W. A frictional force acts in a wafer rotating direction on a lower surface of the chemical liquid puddle CL due to friction between the chemical liquid puddle CL and the opposed region A1 of the wafer W. Therefore, a tangential force acts in the wafer rotating direction on the peripheral edge of the lower surface of the chemical liquid puddle CL.

Figure 7D:
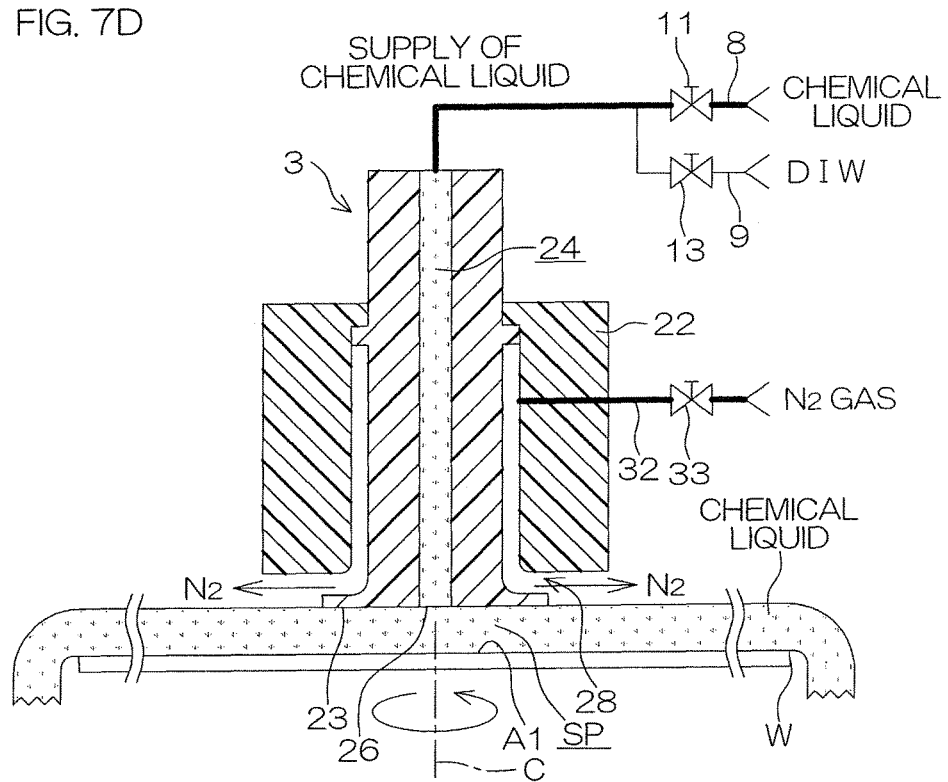

At predetermined supply start timing after the rotation speed of the wafer W reaches a predetermined liquid treatment rotation speed (e.g., about 500 rpm), the control section 18 opens the chemical liquid valve 11 with the DIW valve 13 kept closed to spout the chemical liquid from the outlet port 26 of the nozzle 3. Thus, the chemical liquid puddle CL is laterally forced out of the space SP and receives a centrifugal force generated by the rotation of the wafer W to move toward the peripheral edge of the wafer W. The tangential force acts on the outer periphery of the lower surface of the chemical liquid puddle CL. Therefore, the chemical liquid of the liquid puddle CL spreads toward the peripheral edge, while having a minimum perimeter, i.e., having a generally round shape. A chemical liquid film formed by subsequently supplying the chemical liquid is dragged by the previously supplied chemical liquid of the liquid puddle CL, and spreads generally roundly toward the peripheral edge of the wafer W on the front surface of the wafer W. Thus, the front surface of the wafer W is generally entirely covered with the chemical liquid film as shown in FIG. 7D.

A period between the formation of the chemical liquid puddle CL and the start of the spouting of the chemical liquid is desirably as short as possible in order to suppress excess treatment of the opposed region A1 of the wafer W with the chemical liquid puddle CL.

Figure 8:
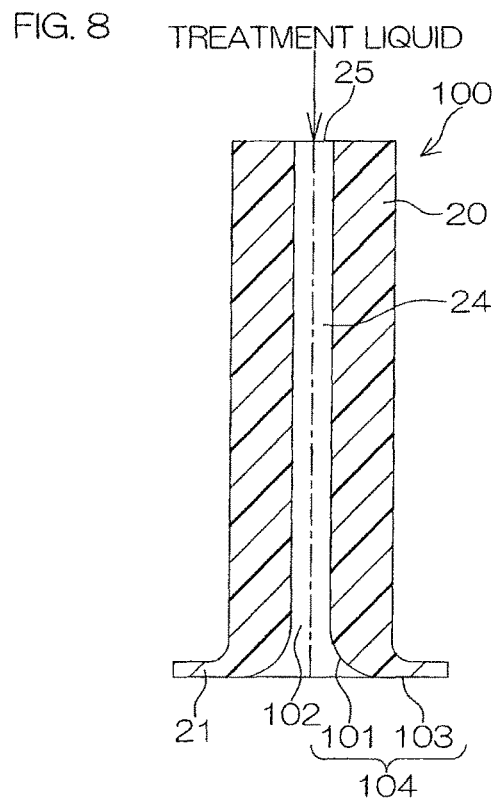
FIG. 8 is a sectional view of a nozzle of a substrate treatment apparatus according to a second embodiment of the present invention.
Figure 9:
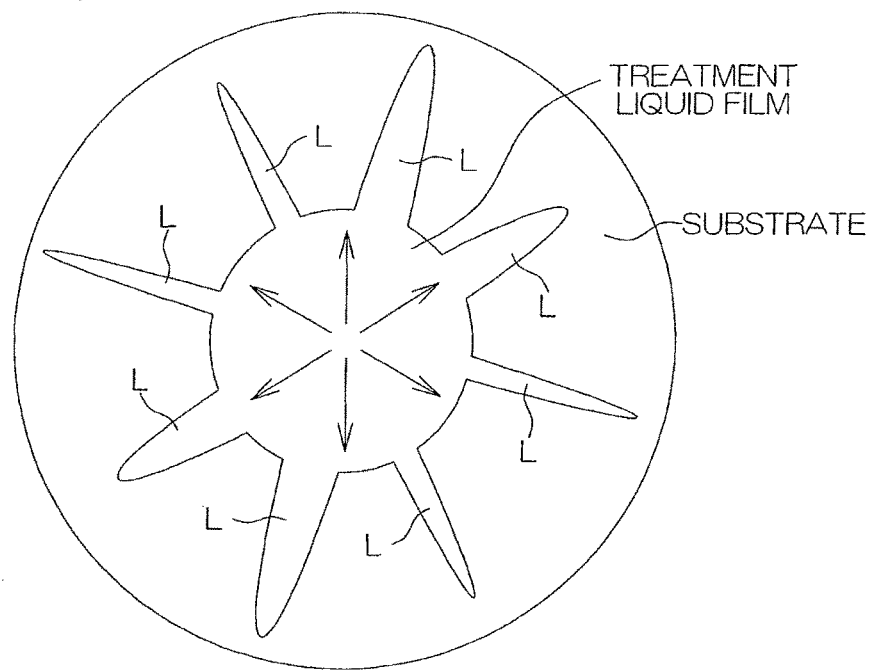
FIG. 9 is a schematic plan view showing the spreading of a treatment liquid supplied to a front surface of a substrate.

FIG. 8 is a sectional view of a nozzle 100 of a substrate treatment apparatus according to another embodiment (second embodiment) of the present invention.

In the second embodiment, components corresponding to those shown in FIG. 2 will be designated by the same reference characters as in FIG. 2, and duplicate description will be omitted.

A nozzle 100 shown in FIG. 8 differs from the nozzle 3 shown in FIG. 2 mainly in that a round opposing surface 104 provided in the lower surface of the disk portion 21 includes a convexly curved surface (curved surface) 101 provided in a center portion thereof. The opposing surface 104 has been imparted with a hydrophilic property.

The convexly curved surface 101 is flared downward as extending radially outward from the center of the opposing surface 104. The flow passage 24 has a generally round outlet port 102 provided at the center of the opposing surface 104. The opposing surface 104 has an annular horizontal flat surface 103 provided in a peripheral portion thereof continuously from the convexly curved surface 101. Therefore, when the nozzle 100 is located at the adjacent position, the convexly curved surface 101 becomes closer to the front surface of the wafer W in a direction radially away from the outlet port 102.

The chemical liquid or the DIW supplied into the flow passage 24 through the inlet port 25 flows through the flow passage 24 and then spouted from the outlet port 102. Where a space defined between the opposing surface 104 and the opposed region A1 is filled with the chemical liquid or the DIW in a liquid filled state, the chemical liquid or the DIW spouted from the outlet port 102 is supplied to the front surface of the wafer W through the convexly curved surface 101. This substantially prevents eddies from occurring between the outlet port 102 and the rotation center of the front surface of the wafer W when the space between the opposing surface 104 and the opposed region A1 is kept in the liquid filled state, thereby preventing bubbling in the liquid.

The nozzle 100 further differs from the nozzle 3 in that the cover 22, the joint 31, the nitrogen gas supply pipe 32 and the like for spouting the nitrogen gas are not provided.

While the two embodiments of the present invention have thus been described, the present invention may be embodied in other ways.

In the exemplary processes associated with the first embodiment, the spouting of the DIW or the chemical liquid for the formation of the liquid puddle DL or CL may be started before the start of the rotation of the wafer W rather than after the start of the rotation of the wafer W.

The cover 22, the joint 31, the nitrogen gas supply pipe 32 and the like for spouting the nitrogen gas may be removed from the nozzle 3 according to the first embodiment.

In the exemplary processes described above, the DIW is used for the formation of the liquid puddle DL by way of example, but carbonated water, electrolyzed ion water, ozone water, reduced water (hydrogen water) or magnetized water may be used instead of the DIW.

In the exemplary processes described above, the opposing surface 23, 104 of the nozzle 3, 100 is opposed to and spaced a minute distance from the upper surface of the wafer W by way of example, but may be opposed to and spaced a minute distance from a lower surface of the wafer W. Further, two such nozzles may be provided, which respectively have opposing surfaces to be opposed to and spaced a minute distance from the upper and lower surfaces of the wafer W.

As indicated by a one-dot-and-dash line in FIG. 1, the DIW nozzle 110 may be provided additionally to the nozzle 3. In this case, the DIW may be supplied to the rotation center of the front surface of the wafer W from the DIW nozzle 110 for a rinsing operation.

The DIW is used as the rinse liquid by way of example, but the rinse liquid is not limited to the DIW. Other examples of the rinse liquid include carbonated water, electrolyzed ion water, ozone water, reduced water (hydrogen water) and magnetized water.

The effects of the present invention are particularly notable where the substrate (wafer W) has a hydrophobic surface. For example, a substrate subjected to an oxide film (silicon oxide film) removing process or a resist removing process is liable to have a hydrophobic surface.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2010-219048 filed in the Japanese Patent Office on Sep. 29, 2010, the disclosure of which is incorporated herein by reference in its entirety.

What is claimed is:

1. A substrate treatment method comprising:
    an opposing surface positioning step of positioning a round opposing surface of a nozzle formed with an outlet port in opposed spaced relation to a first region of a front surface of a substrate horizontally held, wherein said round opposing surface has a diameter smaller than the diameter of the substrate, and said first region of the front surface of the substrate is defined within a peripheral edge of the substrate and containing a rotation center of the substrate;
    a rotating step of relative rotating between the substrate and the opposing surface of the nozzle about a vertical axis defined through said first region;
    a liquid filling step of supplying a liquid between the front surface of the substrate and the opposing surface of the nozzle to form a liquid film which covers a second region which includes all of the first region and is wider than the first region, wherein the liquid film fills a space defined between the opposing surface of the nozzle and the first region of the front surface of the substrate opposed to the opposing surface of the nozzle to place said space in a liquid filled state, in parallel to the rotating step;
    a supply stopping step of stopping the supplying of the liquid while rotating the substrate after the liquid film fills the space to place the space in said liquid filled state, the supply stopping step spinning off an outside portion present outside the space of the liquid film by centrifugal force caused by the rotation of the substrate, whereby a liquid puddle which is in contact with the front surface of the substrate and the opposing surface of the nozzle only inside the space is formed;
    a liquid puddle keeping step of maintaining the supplying of the liquid stopped in parallel to the rotating step after the supply stopping step, whereby the liquid puddle is kept in contact with the front surface of the substrate and the opposing surface of the nozzle; and
    a treatment liquid spouting step of spouting a treatment liquid from the outlet port again, the treatment liquid spouting step being performed in parallel to the rotating step, and subsequent to the liquid puddle keeping step.

2. The substrate treatment method according to claim 1, wherein the liquid filling step includes a water filling step of supplying water between the front surface of the substrate and the opposing surface of the nozzle to fill the space with the water in a liquid filled state,
    wherein the treatment liquid spouting step includes a chemical liquid spouting step of spouting a chemical liquid from the outlet port.

3. The substrate treatment method according to claim 2, further comprising:
    a water spouting step of spouting water from the outlet port, the water spouting step being performed in parallel to the rotating step, after the water filling step, and before the chemical liquid spouting step;
    wherein the spouting of the chemical liquid in the chemical liquid spouting step follows the spouting of the water in the water filling step.

4. The substrate treatment method according to claim 1, wherein the treatment liquid spouting step includes a chemical liquid spouting step of spouting a chemical liquid from the outlet port,
    wherein the liquid filling step includes a chemical liquid puddle forming step of supplying the same chemical liquid as that spouted in the chemical liquid spouting step between the front surface of the substrate and the opposing surface of the nozzle to fill the space with the chemical liquid in a liquid filled state.

5. The substrate treatment method according to claim 1, wherein the radius of the opposed surface is in a range of $\frac{1}{10}$ to $\frac{1}{8}$ of the radius of the substrate.

6. The substrate treatment method according to claim 1, wherein the opposing surface has been imparted with a hydrophilic property.

7. The substrate treatment method according to claim 1, further comprising: an inert gas spouting step of spouting an inert gas radially along the surface of the substrate in the treatment liquid spouting step.

* * * * *